(12) United States Patent
Birkmire et al.

(10) Patent No.: US 6,676,994 B2
(45) Date of Patent: Jan. 13, 2004

(54) METHOD FOR PRODUCING THIN FILMS

(75) Inventors: Robert W. Birkmire, Newark, DE (US); Erten Eser, Newark, DE (US); Gregory M. Hanket, Newark, DE (US); Brian E. McCandless, Elkton, MD (US)

(73) Assignee: University of Delaware, Newark, DE (US)

( * ) Notice: Subject to any disclaimer, the term of this patent is extended or adjusted under 35 U.S.C. 154(b) by 83 days.

(21) Appl. No.: 09/819,277

(22) Filed: Mar. 28, 2001

(65) Prior Publication Data
US 2002/0054958 A1 May 9, 2002

Related U.S. Application Data
(60) Provisional application No. 60/193,662, filed on Mar. 31, 2000.

(51) Int. Cl.[7] .......................... C23C 16/00; C23C 16/06
(52) U.S. Cl. .................. 427/255.28; 427/255.33; 427/255.5; 427/255.7; 427/255.29
(58) Field of Search .................. 427/248.1, 255.23, 427/585, 587, 592, 593, 255.28, 255.29, 255.31, 255.32, 255.33, 255.34, 255.5, 255.7; 118/715, 719, 725, 726, 718, 729

(56) References Cited

U.S. PATENT DOCUMENTS 5,532,102 A * 7/1996 Soden et al. ................. 430/128
5,759,634 A * 6/1998 Zang .......................... 427/446
6,444,043 B1 * 9/2002 Gegenwart et al. .......... 118/726

OTHER PUBLICATIONS

Definition of "furnace" from Hackh's Chemical Dictionary, 4th Edition, © 1969 by McGraw–Hill, Inc., Julius Grant, Editor, p. 286.*

* cited by examiner

Primary Examiner—Bret Chen
Assistant Examiner—William Phillip Fletcher, III
(74) Attorney, Agent, or Firm—Connolly Bove Lodge & Hutz LLP

(57) ABSTRACT

Thin films are produced by a method wherein a material is heated in a furnace placed inside a vacuum system. An inert gas is flown over/through the heated material. The vapors of the material are entrained in the carrier gas which is then directed onto a substrate heated to a temperature below that of the furnace temperature and placed in close proximity to the exit of the furnace.

19 Claims, 3 Drawing Sheets

METHOD FOR PRODUCING THIN FILMS

CROSS-REFERENCE TO RELATED APPLICATION

This application is based upon provisional application Ser. No. 60/193,662, filed Mar. 31, 2000.

BACKGROUND OF THE INVENTION

U.S. Pat. No. 5,945,163 discloses an apparatus and method for depositing a material on a substrate. In that patent a distributor is utilized which includes a heated permeable member through which a carrier gas and a material are passed to provide a vapor that is deposited on a conveyed substrate. The permeable member is tubular and has an electrical voltage applied along its length to provide the heating and the carrier gas and the material as a powder are introduced into the tubular permeable member for flow outwardly therefrom as the vapor. A shroud extends around the tubular permeable member and has an opening through which the vapor flows for the deposition.

It would be desirable if improved techniques could be provided for producing thin film.

SUMMARY OF THE INVENTION

An object of this invention is to provide improved methods for producing thin film.

In accordance with this invention the material to be produced as a thin film is heated to a sufficient temperature T in a furnace placed inside of a vacuum system. An inert carrier gas is flown over/through the heated material and the vapors of the material are entrained in the carrier gas. Carrier gas containing the vapors of the material is directed onto a substrate heated to a temperature below that of the furnace temperature and placed in close proximity to the exit of the furnace.

Carrier gas flow is adjusted to give:

A sufficient degree of entrainment of the material during contact with the source, A pressure inside the vacuum enclosure that would be high enough to suppress any re-evaporation from the substrate, The desired deposition rate.

The vacuum system could be pressurized by a secondary inert gas inlet not going through the source to give more flexibility for the adjustment of the carrier gas flow going through the furnace.

THE DRAWINGS

DETAILED DESCRIPTION

All of the details of application Ser. No. 60/193,662 are incorporated herein by reference thereto.

The invention enables high substrate temperature deposition of materials that have high vapor pressure, which would otherwise not stick to the substrate. Material utilization rate is very close to 100%. Such high utilization rate would reduce operational cost by:

Reducing material cost—no wastage,

Low maintenance and reduced downtime.

The method of the present invention does not require capital cost intensive high vacuum system; rather a low cost, mechanical pump generated low vacuum system is acceptable. The invention allows precise control of deposition rate by controlling gas flows both into the furnace and/or into the system. In fact, the deposition can be initiated and stopped by respectively reducing and increasing the pressure inside the system.

The invention also allows deposition of multi-layer films by placing multiple furnaces one after another in a vacuum system without costly schemes of physically separating deposition zones from each other. This is because 100% material utilization in each zone prevents any possibility of cross-contamination.

The invention is particularly useful for the deposition of CdTe films at high rates and at high substrate temperature. Other possible uses include high substrate temperature deposition of:

Any other congruently evaporating compounds such as CdS,

Other high vapor pressure compounds such as $In_2Se_3$, CuCl,

Other high vapor pressure single component materials.

The following description provides first-order design calculations for CdTe deposition by a carrier gas. Following the description of the first-order design calculation is a description relating to vapor-resistant evaporation source in prototype experiment.

Figure 1:
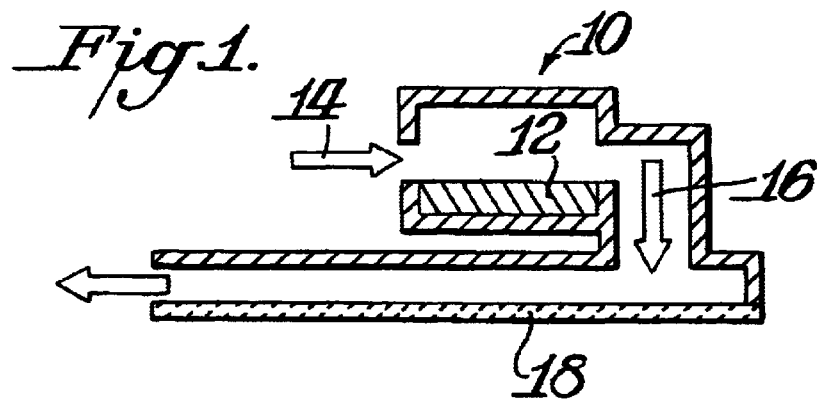
FIG. 1 is a schematic showing of the inert carrier gas flow used for deposition in accordance with this invention.

FIG. 1 schematically illustrates the furnace 10 which contains source material 12. Inert carrier gas enters container 10 as shown by arrow 14 which exits furnace 10 as shown by arrow 16 to flow over substrate 18.

Figure 2:
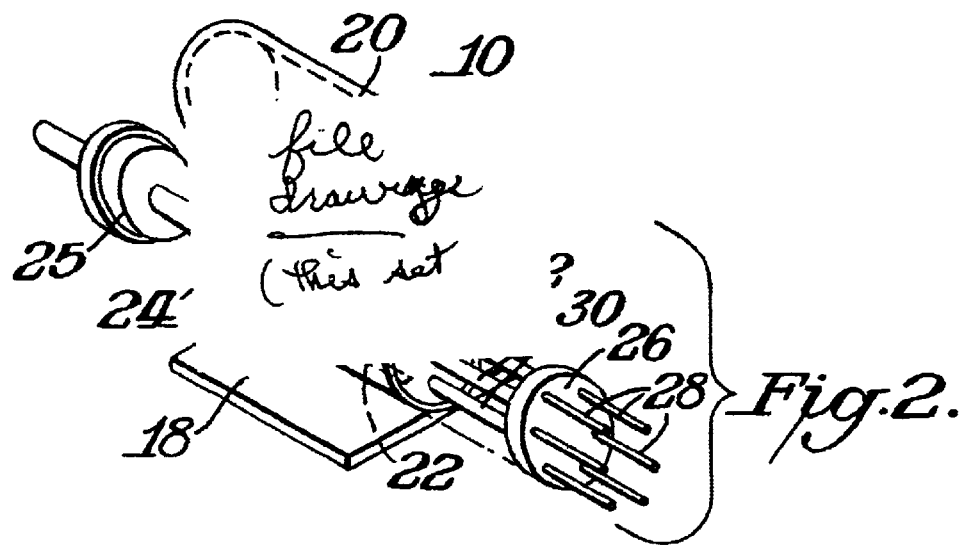
FIG. 2 is an exploded isometric view of a prototype source in accordance with this invention.
Figure 4:
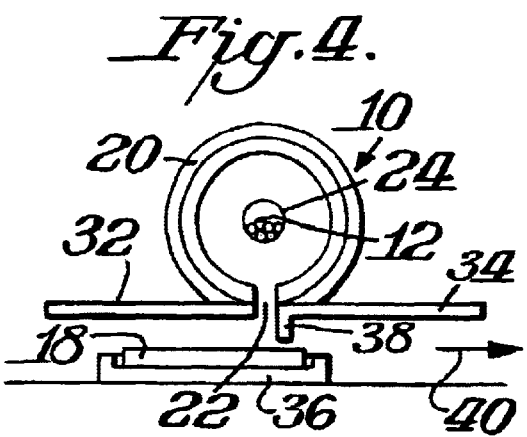
FIG. 4 is an end view with the substrate of the source shown in FIGS. 2–3.
Figures 3A, 3B:
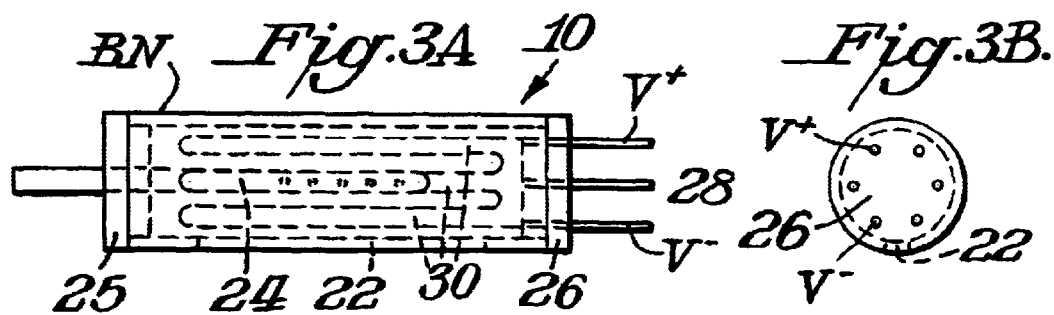
FIGS. 3A and 3B are a side view and an end view, respectively, of the source shown in FIG. 2.
Figure 5:
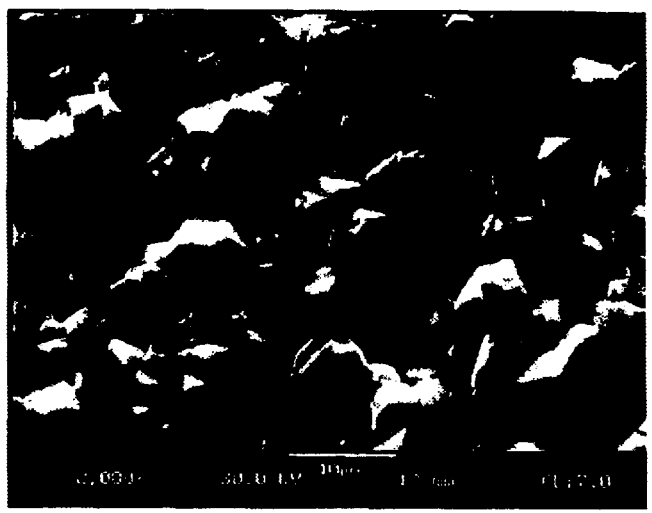
FIG. 5 is an SEM Image of example 2002 at the center of the deposition zone.
Figure 7:
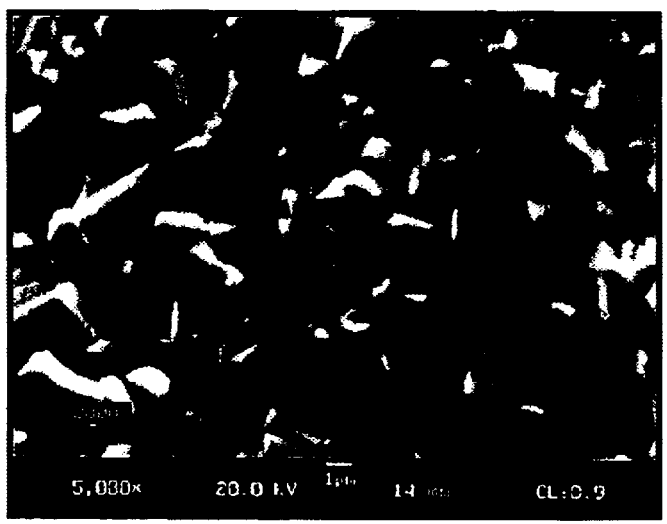
FIG. 7 is an SEM Image of example 2008 at the center of the deposition zone.
Figure 8:
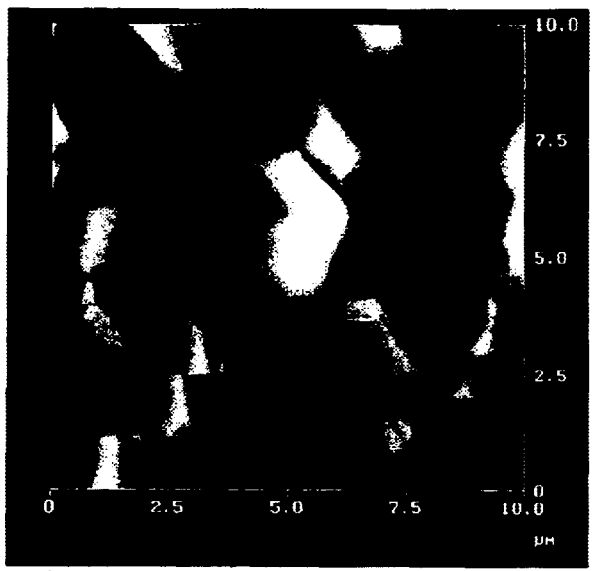
FIG. 8 is an AFM Image of example 20089 a the center of the deposition zone.
Figure 6:
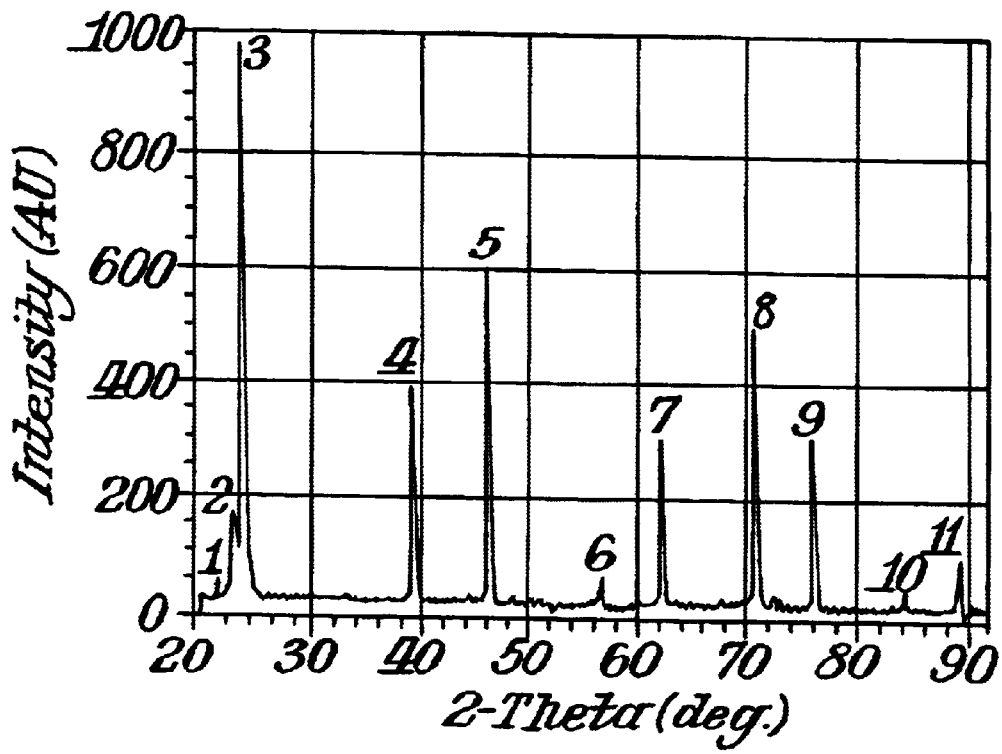
FIG. 6 is an X-Ray diffraction pattern of example 2002.
Figure 9:
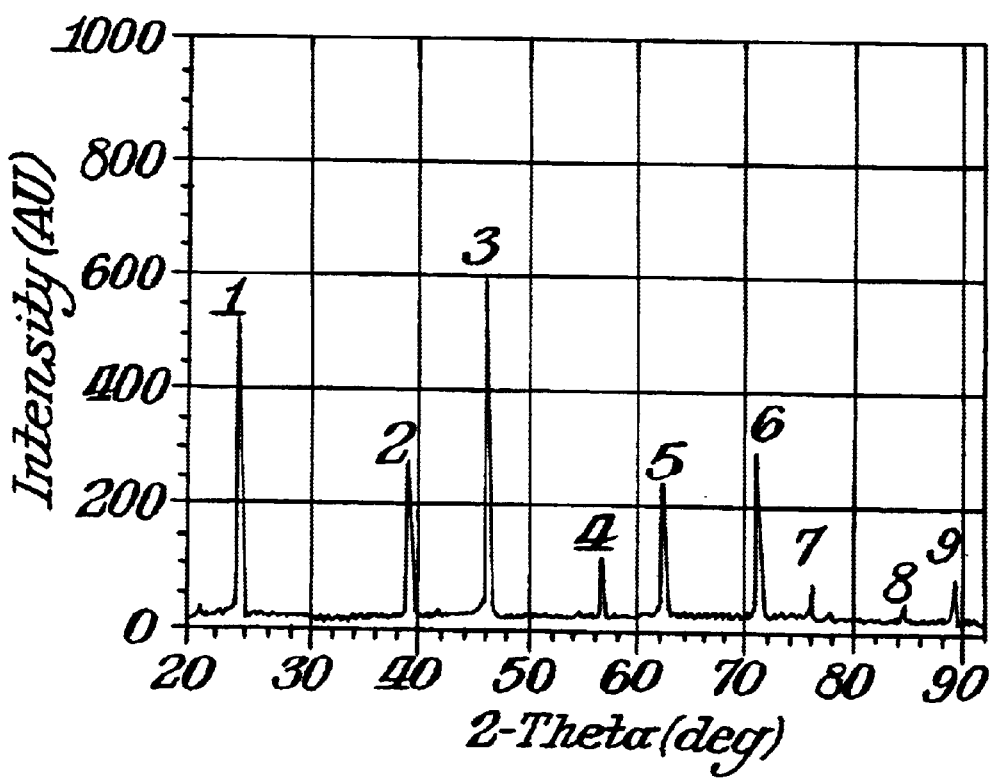
FIG. 9 is an X-Ray diffraction pattern of example 2008.

As shown in FIGS. 2–4 the system for practicing the method of this invention includes a vacuum system in which the furnace 10 is located. The furnace is in the form of a cylindrical container which is covered by a cylindrical radiative shield 20. The shield and the container have a longitudinal slot 22 through which the carrier gas would flow. Accordingly, the slot functions as a discharge opening. The source material 12, such as CdTe, is located in a perforated quartz ampoule 24 which extends through a removable plug closing the upstream end of the container. The perforated ampoule 24 is located along the longitudinal axis of the container. The carrier gas enters the furnace through the tubular basket. A removable plug 25 is in the upstream end of the container 10. A second removable plug 26 in the downstream end of the container is used for mounting the heating structure which is illustrated as being a thermocouple 28 having a plurality of filaments 30 equally spaced along an arc surrounding the ampoule 24. A heated plate or platen 32 is located along one edge of the discharge opening 22 of the container still located within the vacuum system. A further heated plate 34 is mounted adjacent to the opposite side of the discharge opening 22. The substrate 18 is mounted on a heated plate 36 and moves in a direction below and parallel to the heated platen 32 and heated plate 34 transverse to the longitudinal discharge opening. As illustrated in FIG. 4 one of the heated plates 34 has a downwardly extending flange 38 which is spaced slightly above the path of movement 40 of the substrate which would thereby direct the flow of the carrier gas toward the substrate. The carrier gas has a flow path between the heated platen 32 and the moving substrate 18.

This document presents a methodology and quantitative results for the design of a CdTe deposition system using a carrier gas. In the design, the carrier gas is saturated with CdTe vapor (actually Cd and $Te_2$), the flowed through the deposition zone. By maintaining the CdTe source at a higher temperature than the substrate, the vapor above the substrate becomes supersaturated, and deposits on the substrate. A conceptual schematic of the process is shown in FIG. 1. A key advantage of an inert atmosphere CdTe process over a vacuum CdTe process is the suppression of film re-evaporation during substrate cooldown.

By maintaining $T_{source} > T_{platen} > T_{substrate}$ CdTe vapor generated in the source becomes supersaturated in the deposition zone, and deposits on the substrate. Argon has been arbitrarily chosen as the carrier gas.

1. Mass-transfer Characterization

A first order design (to determine feasibility of the proposed process) requires the development of a mass balance and a worst-case estimate of the mass transfer rates in the system.

The following discussion has as its objective to demonstrate the viability of carrier-assisted CdTe deposition with grown rate of ~0.1 to 1.0 μm/min at system pressures of 10 to 100 Torr.

1. Prototype Source Schematic Diagrams

FIGS. 2–4 are views of the prototype source equipment.

2. Power Ratings for 6 loop Kanthal filament, 90 cm L, 0.032 gauge (0.8 mm dia)

Initial resistance. R=3.5 Ω

After Heating @ 44V for 10 min in $N_2$. R=4.5 Ω.

TABLE 2.1

Filament power at different settings.

| Variac Setting | Measured Voltage (V) | Measured Current (A) | Measured Power (W) | Estimated Current from $P = I^2R$ |
|---|---|---|---|---|
| 10 | 11 | 3.3 | 36 | 2.8 |
| 20 | 22 | 6.6 | 145 | 5.7 |
| 30 | 33 | 9.7 | 320 | 8.4 |
| 40 | 44 | 12.5 | 550 | 11.0 |

3. Prototype Source #1—Circular Effusion Aperture, "Floating" Substrate Temperature

20001

Base Pressure=18 mTorr

Deposition Pressure 20–23 Torr

Carrier Gas Flow Rate=20 sccm Argon

Variac Setting=40% (44V, 12.5 A, 550 W)

"Steady-State." Internal Source Temperature=945° C.

Sample to Orifice Distance=1.5 cm

Deposition time (at T>880° C.)=2 minutes

Substrate=1"×2" L.O.F. 3.5 mm $SL/SnO_2$

Comment: Sample touched heat shield and broke during deposition. Grey deposit 0.5 μm thick, XRD=>CdTe; growth rate ~0.25 μm/min. Rapidly raised system pressure to 200 Torr—seemed to stop deposition on exposed metal surface.

20002

Base Pressure=8 mTorr

Deposition Pressure 20–21 Torr

Carrier Gas Flow Rate=20 sccm Argon

Variac Setting=40% (44V, 12.5 A, 550 W)

"Steady-State" Internal Source Temperature=935° C.

Sample to Orifice Distance=1.7 cm

Deposition time (at T>880° C.)=6.5 minutes

Substrate=2"×3" Corning 1.5 mm 7059/ITO/CBD CdS

Comment: Sample remained intact, developed grey coating at minute 6 (T=899° C.). Central 2 cm diameter region measured 7.5 μm thick; growth rate ~1.1 μm/min. Band of pinholes and progessively thinner towards edges.

$$\tau_D = \frac{h^2}{D_{CdTe, Ar}} \quad \text{(eqn. 1)}$$

where $\tau_D$ is the diffusion characteristic time (sec), h is the height of the gas phase above the CdTe source/sink (cm), and $D_{CdTeAr}$ is the diffusivity of CdTe vapor in argon ($cm^2$/sec).

An estimate of the diffusivity for a 2 component mixture is obtained using Chapman-Enskog theory:

$$D_{AB} = 0.0018583 \frac{\sqrt{T^3\left(\frac{1}{M_A} + \frac{1}{M_B}\right)}}{P\sigma_{AB}^2 \Omega_{D, AB}} \quad \text{(eqn. 2)}$$

where T is in K, P is the pressure in atm $\sigma_{AB}^2$ is the effective molecular diameter in Å, $M_B$ is the molecular weight of component i, and $\Omega_{D,AB}$ is a tabulated dimensionless correction factor which accounts for intermolecular attraction/repulsion. $\Omega_{D,AB}$ varies between 0.5 and 2 —for these calculations it has been assumed equal to unity. Values for the other parameters are shown in the section 3.

As a rule of thumb, a system reaches equilibrium after a time of about 4τ. Therefore, for a carrier gas either unsaturated or supersaturated, it will reach the saturation pressure of CdTe at a time of $4\tau_D$. Since a continuously flowing system is under examination, the requirement for saturation is that $$\Theta \geq 4\tau_D \quad \text{(eqn. 3)}$$

where $\Theta$ is the residence time given by $$\Theta = L/v \quad \text{(eqn. 4)}$$

where v is the linear gas velocity (cm/sec), and L is the length.

In reality, the mass transfer of any system is typically enhanced by the presence of velocity gradients, thereby reducing the characteristic time. The approach exemplified by eqns. 3 and 4 therefore places an upper bound on the minimum required residence time.

At this stage, only two characterizations of the flow regime have been made, the Reynolds number $$Re = \frac{\rho v h}{\mu} \quad \text{(eqn. 5)}$$

where ρ is the gas density (g/$cm^3$) and μ is the gas viscosity (g/cm/sec), and the mean free path $$\lambda = \frac{RT}{\sqrt{2}\,\pi\sigma_{AB}^2 p N_{AV}} \quad \text{(eqn. 6)}$$

where R is the ideal gas constant and $N_{AV}$ is Avogadro's number, $6{,}022 \times 10^{23}$/mol. The gas viscosity (g/cm/sec) is independent of the system pressure and is given by Chapman-Enskog theory:

$$\mu = 2.6693 \times 10^{-5} \frac{\sqrt{MT}}{\sigma^2 \Omega_\mu} \quad \text{(eqn. 7)}$$

As with $\Omega_{D,AB}$, $\Omega_\mu$ is a tabulated dimensionless value ranging from about 0.5 to 2.

The primary purpose in calculating Re is to determine whether the flow regime is turbulent or laminar. For flow through a smooth tube, turbulence occurs for $Re > 10^3$, orders of magnitude greater than the situation here (the calculation will be shown in section 3). The presence of laminar flow allows a solution of the velocity and concentration profiles in the system. This is beyond the scope of this document, however.

Further useful characterizations are the Peclet number (Pe), which indicates whether mass transport is primarily diffusive or convective, and the Grashof number (Gr), which is used in estimating free convection driven by thermal gradients.

$$Pe_{AB} = \frac{hv}{D_{AB}} \quad \text{(eqn. 8)}$$

$$Gr = \frac{h^3 \rho^2 g \beta \Delta T}{\mu^2} \quad \text{(eqn. 9)}$$

where g is a gravitational constant and β is the thermal expansion coefficient (easily calculated for a gas).

2. Mass Balance

The mass balance relates the desired CdTe deposition rate ($\mu$m/cm$^2$/min) to the physical design of the CdTe source and deposition zone, as well as the required flow rate of carrier gas.

The mass rate of CdTe carried to the deposition zone is given by $$\dot{N}_{CdTe} = c_{Cd} q = 2 c_{Te_2} q \quad \text{(eqn. 10)}$$

where $N_{CdTe}$ is in moles (dot above indicates rate), q is the volumetric flowrate in cm$^3$/sec, and $c_i$ is the concentration of species i in mol/cm$^3$. The thickness deposition rate assuming 100% utilization of $N_{CdTe}$ is given by.

$$\frac{dz_{CdTe}}{dt} = \frac{\dot{N}_{CdTe} MW_{CdTe}}{\rho_{CdTe} A_{substrate}} \quad \text{(eqn. 11)}$$

Alternately, eqn. 11 can be easily modified to express the area per time that a film of $Z_{CdTe}$ thickness can be deposited on:

$$\frac{dA_{substrate}}{dt} = \frac{\dot{N}_{CdTe} MW_{CdTe}}{P_{CdTe} z_{CdTe}} \quad \text{(eqn. 12)}$$

where $Z_{CdTe}$ is the film thickness and $A_{substrate}$ is the substrate area.

The concentration of Cd and Te$_2$ are determined by the saturation pressure curve of CdTe:

$$\log(P_{CdTe}^{sat}/\text{bar}) = -10650/T - 2.56 \log(T) + 15.80 \quad \text{(eqn. 13)}$$

Where T is in K and 1 bar=1 atm=760 torr. Since the vapor phase stoichiometry is Cd:Te$_2$=2:1, the saturation pressures of Cd and Te$_2$ respectively are $$P_{Cd}^{sat} = 0.67 P_{CdTe}^{sat}(T) \quad \text{(eqn. 14)}$$

and $$P_{Te_2}^{sat} = 0.33 P_{CdTe}^{sat}(T) \quad \text{(eqn. 15)}$$

Concentration is directly correlated to pressure by the ideal gas law:

$$c = \frac{N_{AV}}{V} = \frac{P}{RT} \quad \text{(eqn. 16)}$$

In the source and deposition zone, the rate of accumulation/depletion of CdTe into/out of the carrier gas behaves exponentially:

Source:

$$P_{CdTe,exit} = P_{CdTe}^{sat}(T_{source}) \left[1 - \exp\left(-\frac{\theta_{source}}{\tau_{D,source}}\right)\right] \quad \text{(eqn. 17)}$$

Dep. zone:

$$P_{CdTe,exit} = \quad \text{(eqn. 18)}$$
$$(P_{CdTe}^{sat}(T_{source}) - P_{CdTe}^{sat}(T_{substrate}))\left[1 - \exp\left(-\frac{\theta_{dep\text{-}zone}}{\tau_{D,dep\text{-}zone}}\right)\right]$$

These equations assume no pressure drop through the system. These equations are coupled by the requirement that the volumetric flow rate of carrier gas be the same for the source and deposition zone (this assumes that the partial volume of CdTe vapor is negligible).

3. Sample Calculations

Clearly, a spreadsheet is best used to study the influence of the design variables (P, T, h, L, q) on the deposition rate. The following sample calculations are useful in placing an order of magnitude estimate on the design variables, however.

The diffusion coefficient was calculated using the following values:

$$D_{AB} = 0.0018583 \frac{\sqrt{T^3 \left(\frac{1}{39.9 \text{ g/mol}} + \frac{1}{200 \text{ g/mol}}\right)}}{P(3.5 \text{ Å})^2 (1)} \quad \text{(eqn. 19)}$$

For T=600° C.=873 K and P=50 torr=0.066 atm, $D_{AB}$=10.3 cm$^2$/sec. Note that the diffusivity is determined primarily by argon, since it is much lighter than Cd or Te—as a result, the vapor phase stoichiometry of CdTe does not have a significant influence on the diffusivity.

The viscosity of the Ar carrier gas (neglecting the CdTe vapor) is easily calculated:

$$\mu = 2.6693 \times 10^{-5} \frac{\sqrt{(39.9 \text{ g/mol})T}}{(3.5 \text{ Å})^2 (1)} \quad \text{(eqn. 20)}$$

For T=600° C.=873 K, m=$4.07 \times 10^{-4}$ g/cm/sec.

For a gas velocity of v=10 cm/sec, a zone height of h=1 cm, and a pressure of 50 torr, the gas density and Re are calculated as follows:

$$\rho = \frac{(50 \text{ torr})(39.9 \text{ g/mol})}{(6.24 \times 10^4 \text{ cm}^3\text{torr/mol/K})(873 \text{ K})} = 3.66 \times 10^{-5} \text{ g/cm}^3 \quad \text{(eqn. 21)}$$

$$Re = \frac{(3.66 \times 10^{-5} \text{ g/cm}^3)(10 \text{ cm/sec})(1 \text{ cm})}{(4.07 \times 10^{-4} \text{ g/cm/sec})} = 0.90 \quad \text{(eqn. 22)}$$

Now that the basic physical constants have been estimated, it is possible to proceed with the source design. The first-cut design assumes that the CdTe vapor exits the source at its saturation pressure—this condition is approximated by $$\frac{\theta}{\tau_D} \geq 4.$$

This condition is met by limiting the velocity of the carrier gas through the source to sufficiently increase the residence time. Since this is a worst case design, the physical situation is a carrier gas flowing above a planar source. The source could be designed for better performance by flowing the carrier gas through a packed bed of CdTe chunks, for example. After the saturation condition has been implemented, the velocity and maximum theoretical deposition rate (based on assumption of 100% utilization of CdTe in the deposition zone) can be estimated as a function of source geometry (height, width, and length), system pressure, and CdTe saturation pressure.

Assuming a source width of 10 cm and height of 1 cm, the following estimate for gas velocity, flow rate, and deposition rate were calculated:

APPENDIX

Values Used in Calculations

| Variable | Value | Units | Name |
|---|---|---|---|
| R | 0.08206 | L-atm/mol-K | Ideal gas constant |
|  | 62.4 | L-torr/mol-K |  |
|  | 6.24 × 10$^4$ | cm$^3$-torr/mol-K |  |
| $N_{AV}$ | 6.022 × 10$^{23}$ | 1/mol | Avogadro's number |
| $MW_{Ar}$ | 39.95 | g/mol | Molecular weight - Argon |
| $MW_{Cd}$ | 112.4 | g/mol | Molecular weight - Cadmium |
| $MW_{Te}$ | 127.6 | g/mol | Molecular weight - Tellurium |
| $MW_{CdTe}$ | 240.0 | g/mol | Molecular weight - CdTe |
| $\rho_{CdTe}$ | 5.85 | g/cm$^3$ | CdTe density |
| σ | 3.5 | Å | Molecular diameter (assumed same for all gas-phase species) |
| $\Omega_\mu$ | 1 | [dimensionless] | Intermolecular interaction correction for viscosity calculations |
| $\Omega_{AB}$ | 1 | [dimensionless] | Intermolecular interaction correction for diffusivity calculations. |

| Other Variables | |
|---|---|
| P | Pressure |
| T | Temperature |
| v | linear velocity |
| q | True volumetric flow rate |
| $q_{STP}$ | Standardized volumetric flowrate (sccm) |
| N | Molar mass |
| L | Length |
| h | Height of atmosphere above CdTe source/sink |

TABLE 1

Effect of design variables on deposition rate.

| cm L | torr pCdTe | torr pT | ° C. Tsource | cm2/sec DAB | sec char.time | cm/sec velocity | cm3/sec q | sccm qSTP | µm/min/cm2 dep rate | 100 cm2 basis dep rate, µm/min |
|---|---|---|---|---|---|---|---|---|---|---|
| 1 | 1 | 10 | 775 | 67.83318 | 0.014742 | 16.95829 | 169.5829 | 38.31931 | 42.57248477 | 0.425725 |
| 1 | 1 | 50 | 775 | 13.56664 | 0.07371 | 3.391659 | 33.91659 | 38.31931 | 8.514496955 | 0.085145 |
| 1 | 1 | 100 | 775 | 6.783318 | 0.14742 | 1.695829 | 16.95829 | 38.31931 | 4.257248477 | 0.042572 |
| 1 | 10 | 50 | 900 | 16.0645 | 0.062249 | 4.016126 | 40.16126 | 40.5399 | 90.07910192 | 0.900791 |
| 1 | 10 | 100 | 900 | 8.032252 | 0.124498 | 2.008063 | 20.08063 | 40.5399 | 45.03955096 | 0.450396 |
| 10 | 1 | 10 | 775 | 67.83318 | 0.014742 | 169.5829 | 1695.829 | 383.1931 | 425.7248477 | 4.257248 |
| 10 | 1 | 50 | 775 | 13.56664 | 0.07371 | 33.91659 | 339.1659 | 383.1931 | 85.14496955 | 0.85145 |
| 10 | 1 | 100 | 775 | 6.783318 | 0.14742 | 16.95829 | 169.5829 | 383.1931 | 42.57248477 | 0.425725 |
| 10 | 10 | 50 | 900 | 16.0645 | 0.062249 | 40.16126 | 401.6126 | 405.399 | 900.7910192 | 9.00791 |
| 10 | 10 | 100 | 900 | 8.032252 | 0.124498 | 20.08063 | 200.8063 | 405.399 | 450.3955096 | 4.503955 |

These results suggest that sufficient deposition rates can be achieved using a carrier gas system. Furthermore, the results suggest that successful operation is achievable over a wide range of pressures.

Determination of actual operating parameters will be based on further analysis. Calculation of Pe, for example, indicates the ability of the carrier gas to "confine" the flow of the CdTe. This is useful not only in confining the CdTe vapor during source heat up, but also in reducing re-evaporation of the CdTe film after the substrate has passed through the deposition zone.

4. Conclusions

The results of this simple analysis indicate that a CdTe/carrier gas deposition process is very robust—that is, there is sufficient room for error in both the design and operation of such processes.

APPENDIX-continued

Values Used in Calculations

| Variable | Value | Units | Name |
|---|---|---|---|
| Θ |  |  | Residence time |
| $\tau_D$ |  |  | Charateristic time for diffusion |
| λ |  |  | Mean free path |
| ρ |  |  | Density |
| µ |  |  | Viscosity |
| $D_{AB}$ |  |  | Diffusivity of mixture of A and B |
| Re |  |  | Reynold's number |
| Pe |  |  | Peclet number |
| Gr |  |  | Grashof number |

TABLE 3.1

X-ray diffraction peak data and assignments of 20002.

| Peak | Raw Counts | 2θ (± 0.05 deg) | d (Å) | Assignment |
|---|---|---|---|---|
| 1 | 48 | 21.40 | 4.15 | 111 $k_\beta$ |
| 2 | 169 | 22.80 | 3.90 | W |
| 3 | 6566 | 23.75 | 3.74 | 111 |
| 4 | 385 | 39.30 | 2.29 | 220 |
| 5 | 605 | 46.45 | 1.953 | 311 |
| 6 | 58 | 56.80 | 1.619 | 400 |
| 7 | 313 | 62.45 | 1.486 | 331 |
| 8 | 504 | 71.25 | 1.322 | 422 |
| 9 | 315 | 76.30 | 1.247 | 511 |
| 10 | 43 | 84.55 | 1.145 | 440 |
| 11 | 109 | 89.40 | 1.095 | 531 |

Texture coefficient = 1.76 (111) => slight (111) texture.
Precision lattice parameter = 6.478 Å ± 0.002 Å.

4. Prototype Source 2—Slit Effusion Orifice, "Floating" Substrate Temperature

20003
  Base Pressure=15 mTorr
  Deposition Pressure 20–21 Torr
  Carrier Gas Flow Rate=20 sccm Argon
  Variac Setting=40% (44V, 12.5 A, 550 W)
  "Steady-State" Internal Source Temperature=694° C.
  Sample to Orifice Distance=1.5 cm
  Deposition time (at T>880° C.)=0 minutes
  Substrate=3"×3 LOF TEC-15 SL/SnO$_2$/Double Coat CBD CdS (P041+P028)/CdCl$_2$ HT
Comment: Sample shattered after 4 minutes, run aborted.

20004
  Base Pressure=15 mTorr
  Deposition Pressure 20–21 Torr
  Carrier Gas Flow Rate=20 sccm Argon
  Variac Setting=40% (44V, 12.5 A, 550 W)
  "Steady-State" Internal Source Temperature=880° C.
  Sample to Orifice Distance=1.7 cm
  Deposition time (at T>850° C.)=6 minutes
  Substrate=4"×2.5" Solarex 7059/SnO$_2$/Single Coat CBD CdS (P038)
Comment: Non-uniformly Colored Deposit. Average Thickness Based on Mass Gain=2 μm.

Prototype Source 2—Slit Effusion Orifice, "Controlled" Substrate Temperature

20005
  Base Pressure=10 mTorr
  Deposition Pressure 20–21 Torr
  Carrier Gas Flow Rate=20 sccm Argon
  Variac Setting=40% (44V, 12.5 A, 550 W)
  Target "Steady-State" Internal Source Temperature=880° C.
  Sample to Orifice Distance=1.7 cm
  Deposition time (at T>850° C.)=0 minutes
  Substrate Temperature: Monitored at edge with wide-gauge TC, set ~500° C. (Variac ~12%).
  Substrate=3"×3" Solarex 7059/SnO$_2$/Single Coat CBD CdS (P045)
Comment: Sample shattered during substrate heat-up, run aborted 20006
  Base Pressure=10 mTorr
  Deposition Pressure 20–21 Torr
  Carrier Gas Flow Rate=20 sccm Argon
  Variac Setting=40% (44V, 12.5 A, 550 W)
  Target "Steady-State" Internal Source Temperature=880° C.
  Sample to Orifice Distance=1.7 cm
  Deposition time (at T>850° C.)=0 minutes
  Substrate Temperature: Monitored at edge with wide-gauge TC, set ~500° C. (Variac ~12%).
  Substrate=3"×3" Solarex 7059/SnO$_2$/Single Coat CBD CdS (P044)
Comment: Sample shattered during substrate heat-up, run aborted. Thermal gradient across sample judged to be excessive—sample touched heater clips.

20007
  Base Pressure=15 mTorr
  Deposition Pressure 20–21 Torr
  Carrier Gas Flow Rate=20 sccm Argon
  Variac Setting=40% (44V, 12.5 A, 550 W)
  Target "Steady-State" Internal Source Temperature=900° C.
  Sample to Orifice Distance=1.7 cm
  Deposition time (at T>850° C.)=6 minutes
  Substrate Temperature: Monitored at edge with wide-gauge TC, set ~465° C. (Variac ~12%).
  Substrate=1"×1" and 1"×0.5" IEC 7059/ITO/Evap CdS samples.
Comment: Samples directly on Vycor heater plate. Deposit thicker in edge band—we don't know the exact temperature in deposition zone. Also, there is significant thermal coupling between source and substrate.

20008
  Base Pressure=10 mTorr
  Deposition Pressure 20–21 Torr
  Carrier Gas Flow Rate=20 sccm Argon
  Variac Setting=40% (44V, 12.5 A, 550 W)
  Target "Steady-State" Internal Source Temperature=880° C.
  Sample to Orifice Distance=1.7 cm
  Deposition time (at T>850° C.)=8 minutes
  Substrate Temperature: Monitored at center with narrow gauge TC, set ~500° C. (Eurotherm). Rose to 600° C. during deposition.
  Substrate=1"×1" and 1"×0.5" IEC 7059/ITO/Evap CdS samples. Comment: Deposition observed from left side to right (left 3 cm is where sparge nozzles are located inside source). Mass gain thickness of longitudinally-centered substrates=2.9 μm; growth rate ~0.4 μm/min.

TABLE 5.1

X-ray diffraction peak data and assignments of 20008.

| Peak | Raw Counts | 2θ (± 0.05 deg) | d (Å) | Assignment |
|---|---|---|---|---|
| 1 | 6566 | 23.75 | 3.74 | 111 |
| 4 | 385 | 39.25 | 2.29 | 220 |
| 5 | 605 | 46.45 | 1.953 | 311 |
| 6 | 58 | 56.80 | 1.619 | 400 |
| 7 | 313 | 62.40 | 1.487 | 331 |
| 8 | 504 | 71.25 | 1.322 | 422 |
| 9 | 315 | 76.30 | 1.247 | 511 |

TABLE 5.1-continued

X-ray diffraction peak data and assignments of 20008.

| Peak | Raw Counts | 2θ (± 0.05 deg) | d (Å) | Assignment |
|---|---|---|---|---|
| 10 | 43 | 84.50 | 1.145 | 440 |
| 11 | 109 | 89.40 | 1.095 | 531 |

Texture coefficient = 0.31 (111) and 1.19 (311) => slight (311) texture.
Precision lattice parameter = 6.478 Å ± 0.002 Å.

6.0 SUMMARY AND CONCLUSIONS

For source to substrate distance ~1–2 cm, achieved depositions at 0.2 to 1 μm/min (20001, 20002, 20008);

Deposits in central band are pure CdTe films having ~5 μm grains and ~random texture (20002 and 20008);

Sparge holes inside source DO affect longitudinal film thickness (all runs);

Deposition can be quickly halted by increasing total system pressure (20001).

What is claimed is:

1. A method for producing thin films comprising placing a source material in a furnace inside a vacuum system, heating the source material while in the furnace to a temperature sufficiently high to create vapors of the material, flowing an inert gas carrier through the furnace in proximity to the heated source material to entrain the vapors of the material in the carrier gas, placing a substrate in the vacuum system at the exit of the furnace, providing a heated platen above the substrate, and flowing the carrier gas containing the vapors between the heated platen and the substrate with the temperature of the furnace being greater than the temperature of the heated platen and with the temperature of the heated platen being greater than the temperature of the substrate so that the vapors generated in the furnace become supersaturated in a deposition zone where the substrate is located resulting in deposition on the substrate.

2. The method of claim 1 including placing the substrate on a heated plate to heat the substrate.

3. The method of claim 2 including moving the substrate parallel to the heated platen, and moving the carrier gas in a flow path between the heated platen and the moving substrate.

4. The method of claim 3 including placing the source material in an elongated perforated container in the furnace, and heating the source material by heating elements disposed around the perforated container.

5. The method of claim 4 wherein the furnace is in the form of an elongated cylindrical container having a longitudinal slot to form a discharge opening, and flowing the carrier gas containing the vapors through the discharge opening.

6. The method of claim 5 wherein the cylindrical container has an upstream end and a downstream end with an end plug in each of the upstream end and the downstream end, flowing the inert gas carrier through the upstream end plug, and mounting the heater to the downstream end plug.

7. The method of claim 6 wherein the perforated container is a perforated ampoule which extends through the upstream end plug.

8. The method of claim 7 including locating the heated platen on one side of the discharge opening, locating a heated plate on the other side of the discharge opening, and moving the substrate parallel to the heated platen and heated plate in a direction transverse to the discharge opening.

9. The method of claim 8 including providing a downwardly extending flange on the heated plate to direct the flow of the carrier gas toward the moving substrate.

10. The method of claim 9 wherein the perforated container is mounted along the longitudinal axis of the container, the heater being a thermocouple having filaments which are equally spaced in an arc around the tubular basket, and providing a radiative shield around the cylindrical container.

11. The method of claim 1 including placing the substrate on a heated plate to heat the substrate.

12. The method of claim 1 including controlling the pressure of the vacuum system by a further inert gas flow which does not flow through the furnace.

13. The method of claim 12 wherein the pressure inside the vacuum system is adjusted to control the rate of effusion of source material vapors from the source, the adjustment being by decreasing the system pressure, the pressure within the source furnace will drop, thereby enhancing the proportion of vapor generated by the source material and wherein increasing the system pressure will raise the pressure inside the source furnace, thereby suppressing evaporation from the source material.

14. The method of claim 1 including initiating the method by reducing the pressure in the vacuum system, and stopping the method by increasing the pressure in the vacuum system.

15. The method of claim 1 including providing a plurality of the furnaces in the vacuum system, and utilizing each of the furnaces to create a multilayer thin film from deposition on the substrate.

16. The method of claim 1 including using CdTe as the source material.

17. The method of claim 1 including using CdS as the source material.

18. The method of claim 1 including maintaining the pressure inside the vacuum source sufficiently high to suppress any re-evaporation from the substrate.

19. The method of claim 1 where the carrier gas is argon.

* * * * *